US005231606A

United States Patent [19]
Gray

[11] Patent Number: 5,231,606
[45] Date of Patent: Jul. 27, 1993

[54] FIELD EMITTER ARRAY MEMORY DEVICE

[75] Inventor: Henry F. Gray, Alexandria, Va.

[73] Assignee: The United States of America as represented by the Secretary of the Navy, Washington, D.C.

[21] Appl. No.: 546,817

[22] Filed: Jul. 2, 1990

[51] Int. Cl.⁵ .............................................. G11C 13/00
[52] U.S. Cl. ................................... 365/225.6; 365/120
[58] Field of Search ............. 365/120, 128, 174, 225.6

[56] References Cited

U.S. PATENT DOCUMENTS 3,040,124  6/1962  Camras ................................. 365/128

Primary Examiner—Terrell W. Fears
Attorney, Agent, or Firm—Thomas E. McDonnell; George Jameson

[57] ABSTRACT

A field emitter array memory device having two or more collector electrodes, an extraction electrode, at least one deflector electrode, and at least one electron field emitter is disclosed. The field emitter array memory circuit has bias voltages for collector electrodes, for the at least one deflector electrode and for the extraction electrode. In a preferred embodiment of the invention, first and second input signal voltages selectively applied to first and second deflector electrodes selectively switch the flow of electrons emitted from an electron field emitter from a first collector electrode to a second collector electrode and vice versa. A latched memory output is also included. Electron flow from the electron field emitter to one of the first and second collector electrodes is maintained until a signal voltage is applied to a deflector electrode to cause the electron flow to deflect from one collector electrode to the other collector electrode.

19 Claims, 1 Drawing Sheet

FIELD EMITTER ARRAY MEMORY DEVICE

BACKGROUND OF THE INVENTION

1. Field of the Invention

The present invention relates to field emitter arrays and particularly to a computer memory element based on field emitter arrays.

2. Description of the Prior Art

Computer memory devices are generally based on semiconductor devices where the charge transport is within a solid. There are also electron beam addressable memory devices known in the art. Electron beam devices use macroscopic electron guns to focus a beam of electrons onto specific targets which charge up and retain a static charge. That is, these devices use cathode ray tube or scanning electron microscope technology where the faceplate or target contains all of the memory cells.

The prior art as it relates to this invention is found in the fields of field emitter array devices, semiconductor based computer memory devices, and electron beam addressable memory devices.

The technology of electron beam addressable memory devices essentially directs an electron beam to a target surface where it changes the amount of charge at a specific location. The devices are large, and are made from individual, macro-components, such as cathode ray tube electron guns. These devices require highly regulated power supplies, and the electron beam control electronics is expensive. Furthermore, the memory has to be continuously refreshed. Electron beam devices also suffer from the fact that they are slow in both reading and writing compared to the subject invention.

Semiconductor memories known in the art are also inherently slower than the present invention by several orders of magnitude. Semiconductor devices are also radiation sensitive, and they are strongly effected by both extremely low and extremely high temperatures. For these reasons, they are limited in their application for military hardware, and where temperature and radiation extremes are expected.

Field emitter array devices are well known in the art, as shown in U.S. Pat. No. 4,721,885, entitled "Very High Speed Integrated Microelectronic Tubes"; U.S. Pat. No. 4,578,614, entitled "Ultra-Fast Field Emitter Array Vacuum Integrated Circuit Switching Device"; U.S. Pat. No. 4,513,308, entitled "P-N Junction controlled Field Emitter Array Cathode"; and U.S. Pat. No. 4,307,507, entitled "Method of Manufacturing a Field-Emission Cathode Structure".

U.S. Pat. No. 4,163,949 entitled "Tubistor" discloses a grown oxide-metal composite having at least a million individual emitting points in each square centimeter of material. This patent discusses the analogy between vacuum tube technology and field emitter devices and states that this type of construction can be used to develop a diode, triode, multigrid, or multicathode structure. However, there is no disclosure of multiple anode, single cathode structures, and no electron deflectors are disclosed. There are also no memory concepts or circuits disclosed.

U.S. Pat. No. 4,728,851, entitled "Field Emitter Device with Gated Memory", discloses a field emitter device having a gate electrode adjacent to an emitter electrode for controlling the initial flow of electrons between the cathode and a collector element. This device is a bistable element which may be used with a display where the collector may be coated with a luminescent material. This device uses a gating electrode to establish the flow between the emitter and the anode. Once flow is established, it is maintained even though the voltage to the gate is removed. It is disclosed that the device provides a bistable memory type device. There is no suggestion of circuitry, or any other means, by which a memory element may be controlled and/or switched. Still further, this device cannot be changed from a first conducting state to a second conducting state by means of a control or deflection electrode. The control grid only permits turning on the device, and does not enable the device to be turned off.

SUMMARY OF THE INVENTION

This invention relates to a field emitter array memory device and circuit for controlling electron emission, and to a bistable memory element based on field emitter arrays.

The field emitter array memory device includes a conducting substrate on which a field emitter is located. Above the conducting substrate is located an insulator, an extraction gate, a second insulating layer, a plurality of deflectors or deflector electrodes, a third insulating layer, and a plurality of collectors or collector electrodes. As electrons are emitted from the field emitter, they strike either a first collector or a second collector. The electrons can be switched from one collector to another by momentarily applying a signal voltage or voltage pulse to one of the deflectors to pull or push the electron beam from a first collector to a second collector. The signal voltages selectively applied to the deflectors may take the form of a short voltage pulse or a step voltage which has sufficient magnitude and time to change the path of the electron beam emanating from the emitter. The field emitter array memory device also includes circuitry for maintaining field emitter array memory operation, collector voltages and bias voltages applied to the deflectors.

In another embodiment, a deflector may be provided with either a positive or a negative voltage pulse. If both positive and negative voltage pulses are available, then they can be applied to a single deflector to pull or push the electron beam from one collector to the other. In this case, only one deflector is needed in this embodiment.

The memory cell of this invention is temperature insensitive and can run very cold or very hot because the electron emission process is not temperature sensitive, as it is in a transistor. This means that the device of this invention may be very attractive for space applications where the device is required to run at very cold temperatures when looking into a 2 degree Kelvin "night sky", or required to run hot when the only cooling available is thermal radiation. Because the field emitter array in the memory device does not need to turn "off" and "on" for its functional operation, but only needs to deflect an electron beam from one collector to another, the inductance problems associated with hard turn-on and turn-off of semiconductor devices are eliminated. This inductance problem has, in the past, limited the size of fast ECL static and random access memory devices.

This device is extremely fast having switching times well below one picosecond. This allows for extremely fast signal and data processing computers, faster than computers based upon standard semiconductor devices.

The memory cell in accordance with this invention is fabricated from one or more field emitter array structures.

Another embodiment of the invention is comprised of a plurality of memory cells, with each memory cell emitting its own associated electron beam.

Additional advantages and features will become apparent as the subject invention becomes better understood by reference to the following detailed description when considered in conjunction with the accompanying drawings.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein.

DETAILED DESCRIPTION OF THE PREFERRED EMBODIMENT

Figure 1:
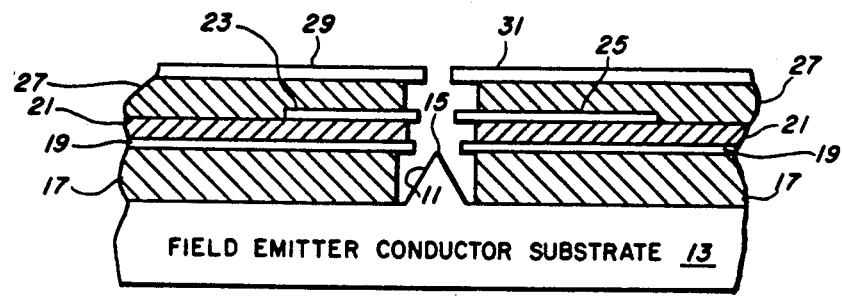
FIG. 1 is a schematic diagram of a field emitter array memory device constructed in accordance with this invention.

The field emitter array memory device of this invention is generally shown in FIG. 1. This field emitter array memory structure may also be constructed as a field emitter array memory cluster in which there are a plurality of the field emitter array memory devices, each being of the type shown in FIG. 1, laid out on a single substrate.

This device has a field emitter 11 which is an extension of a field emitter conductor substrate 13 and rises to a point 15 that permits electron field emission. An insulator layer 17 is disposed between the field emitter conductor substrate 13 and an extraction electrode 19 to electrically isolate the extraction electrode 19 from the conductor substrate 13. Above the extraction electrode 19 is an insulator layer 21. Deflectors or deflector electrodes 23 and 25 are disposed between the insulator layer 21 and another insulator layer 27. Finally, collectors or collector electrodes 29 and 31 are disposed on top of the insulator layer 27. Thus, the conductor substrate 13, extraction electrode 19, deflectors 23 and 25, and collectors 29 and 31 are electrically insulated from each other by the insulator layers 17, 21 and 27.

In the field emitter array memory device of FIG. 1, two different collectors 29 and 31 are used. Either collector 29 or collector 31 will receive electrons, depending upon which one of the deflectors 23 and 25 receives an associated input signal voltage.

Figure 2:
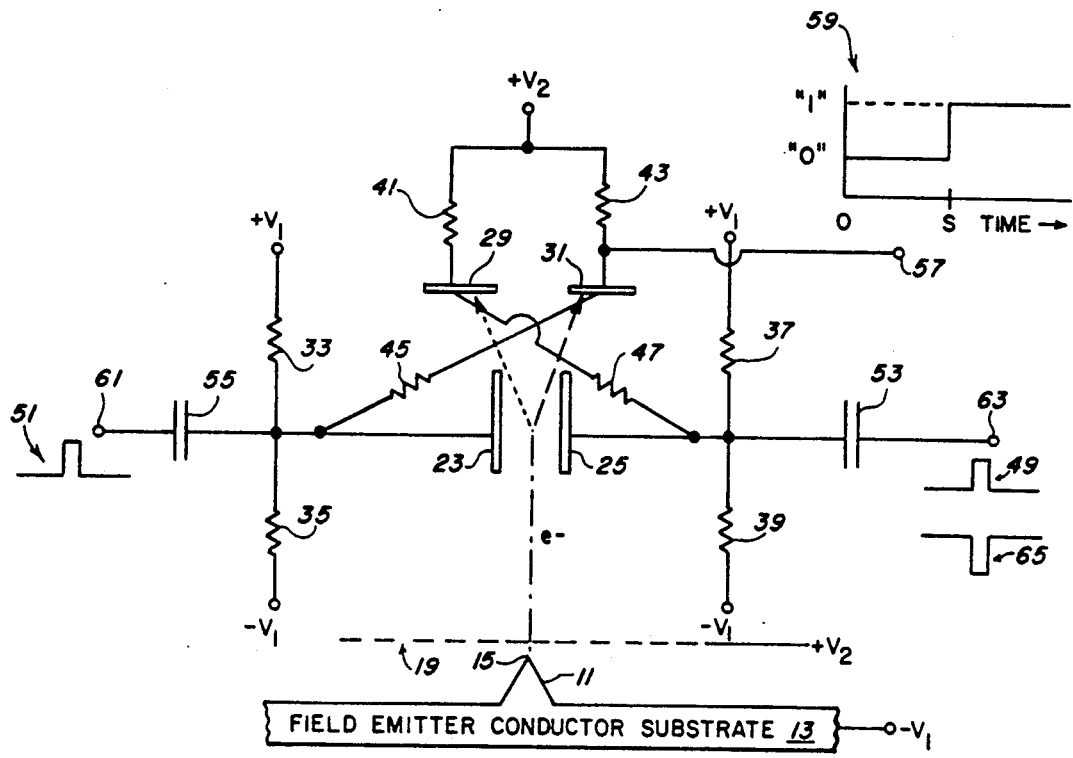
FIG. 2 is a schematic circuit diagram of an electronic circuit illustrating a memory device which incorporates the field emitter array device of FIG. 1.

FIG. 2 is a schematic circuit diagram which illustrates a memory cell constructed in accordance with the field emitter array device of FIG. 1.

When used as a memory device, the circuitry of FIG. 2, in combination with the field emitter array structure shown in FIG. 1, provides for either of two stable electron flow paths. These electron flow paths are from field emitter 11 to either collector 29 or collector 31. When an electron beam is established at either of the collectors 29 and 31, it will remain there until such time that its position is shifted to the opposite collector by action of the deflectors 23 and/or 25.

As seen in FIG. 2, a single electron beam e- is emitted from the field emitter 11 and passes through the space between the deflectors 23 and 25. The beam e- to collector 31 is shown as a series of dashes, and the beam e- to collector 29 is shown as a series of dots. As a memory device, either collector 29 or collector 31 may be selected by direction of the beam e- to one of the collectors. Only one collector receives the beam e- at any time.

The memory cell of FIG. 2 and all of the circuit elements, such as the field emitter array cell, resistors and capacitors, can be integrated on a chip with standard microelectronics fabrication and processing techniques. The resistors 33, 35, 37, 39, 41, 43, 45 and 47 can be, but not necessarily have to be, of the same value. At both the right and left sides of the circuit, there are shown positive input signal voltages 49 and 51 which can be selectively passed through coupling capacitors 53 and 55, respectively. In the embodiment shown in FIG. 2, the output voltage on collector 31 is applied to an output terminal 57. The output signal voltage on the collector 31 will be in the logical "0" state if the beam e- hits the collector 31.

The operation of the memory cell and circuit of FIG. 2 are as follows. When the power to the device is turned on, electrons are emitted from field emitter 11 and they travel to collector 31, where a logical "0" state is created and latched on. The electron flow can be initially established to collector 31 by control of the relative size of bias resistors 45 and 47. The electron beam e- will initially flow to collector 31 if resistor 47 is less than resistor 45. In the logical "0" state condition, when electrons are flowing from the field emitter 11 to the collector 31, the voltage at collector 31 is reduced. The logical "0" state and the logical "1" state of an exemplary signal voltage output waveform 59 is shown in the sketch located next to the output terminal 57 in FIG. 2. The waveform 59 shows the change of the logical state of the output signal voltage when the electron beam e- is switched from collector 31 to collector 29. When the electron beam e- is switched to collector 29, the amplitude of the signal voltage on the collector 31 will be controlled only by the relative resistances of the resistors 35, 45 and 43.

Switching of the memory cell of FIG. 2 from the logical "0" state to the logical "1" state is provided by a positive voltage pulse 51 which is applied to input terminal 61. Collector 31 is at a logical "0" state when the electron beam e- flows to it. The positive voltage pulse 51 applied to input terminal 61 passes through coupling capacitor 55 to the deflector 23, causing the electron beam e- to be pulled from collector 31 to collector 29. As a result, a logical "1" state output signal voltage is developed at output terminal 57. Once the electron beam e- is established at collector 29, it will remain latched there until a further positive voltage pulse 49 is applied to an input terminal 63.

Switching of the memory cell of FIG. 2 from a logical "1" state back to a logical "0" state (moving the electron beam e- from collector 29 back to collector 31) is accomplished by providing a positive voltage pulse 49 to input terminal 63. A positive voltage pulse 49 applied to input terminal 63 passes through coupling capacitor 53 to the deflector 25, causing the electron beam e- to be pulled from the collector 29 back to the collector 31. As a consequence, a logical "0" state output signal voltage is developed at output terminal 57. Once the electron beam e- is established at the collector 31, it will remain latched there until it is reset to collector 29 by the application of another positive voltage pulse 51 to the input terminal 61.

In the structure shown in FIG. 2, one positive voltage pulse can trigger a change in the output signal voltage from a logical "0" state to a logical "1" state or vice versa, depending upon to which one of the deflectors 23 and 25 the positive voltage pulse is applied. It is easier for the memory device to use a voltage pulse of only one polarity, e.g. a positive voltage pulse, since the only charge in a vacuum device is an electron (not electrons and holes such as found in complimentary transistor based semiconductor memories).

This invention is based upon field electron emission from a microminiature field emitter array structure where the electrons can be directed to one or more collectors.

An alternative memory cell can be constructed in accordance with FIG. 2 by providing either a positive voltage pulse 49 or a negative voltage pulse 65 to the input terminal 63. As explained above, when a positive voltage pulse 49 is applied to the input terminal 63, the signal voltage at the deflector 25 rises and the electron beam e- is pulled in the direction of the collector 31. However, if a negative voltage pulse 65 is applied to the input terminal 63, a negative voltage pulse will appear at the deflector 25, while the deflector 23 will remain at a preselected reference voltage (not shown). In this condition, the deflector 25 is more negative than the deflector 23 and, therefore, will push or repel the electron beam e- in the direction of collector 29. Once the electron beam e- is established at collector 29, it will remain latched in this position until a positive voltage pulse 49 is again applied to the input terminal 63 to cause the electron beam e- to be deflected back to the collector 31. It should be realized that with such an alternative memory cell implementation, deflector 23 is unnecessary and therefore can be removed. This is due to the fact that a positive voltage pulse 49 at input terminal 63 will cause the electron beam e- to be pulled to collector 31, whereas a negative voltage pulse 65 at input terminal 63 will push or repel the electron beam e- to collector 29.

If it is decided to make the resistors 45 and 47 equal, then at initial turn-on, minor circuit differences will determine which one of the collectors 29 and 31 will initially receive the emitted electron beam e-. In this case, the memory cell can be initially set to a known value by placing an initial set voltage pulse on input terminal 61 or on input terminal 63. For example, if the electron beam e- is initially flowing to collector 29 and a positive pulse is applied to input terminal 61, collector 29 will retain the electron beam e-, and a logical "1" state output signal voltage will continue to be developed at output terminal 57.

It is also possible to adjust the initial condition of voltages on collectors 29 and 31 by changing the values of the resistors 41 and 43 to be non-equal, while leaving the resistors 45 and 47 equal in value. In this condition, one of the collectors 29 and 31 will be more positive than the other, thereby establishing the direction of the initial electron flow from the emitter 11.

The extraction electrode 19 provides an extraction field for extracting the electron beam e- from the field emitter 11.

The output at collector 31 is in a logical "0" state when the output signal voltage on the collector 31 is low, and in a logical "1" state when the output signal voltage on the collector 31 is high, as shown in the signal voltage output waveform 59 in FIG. 2.

In this device, only the path of the electrons is changed by selectively applying an input signal voltage pulse to one of the deflectors 23 and 25. Therefore, the requirement to turn the field emitter array "on" and "off" is eliminated which, in turn, eliminates the starting and stopping of circuit currents, as is experienced in conventional transistor technology memory cells. This factor becomes very important where computers are constructed with millions of transistor elements. Although each transistor draws a small amount of current, very high changes in circuit current are encountered when millions of transistors are being switched. In computer technology, very large power supplies with high inductances are necessary in order to maintain a constant voltage. Since there is high inductance, switching problems become greater and greater as the number of transistors in a given space switch at the same time.

Electron transit times in micron-scale field emitter arrays are less than 1 picosecond. An electron transit time of 1/10 of one picosecond may be possible. This, therefore, is an improvement of several orders of magnitude in switching time compared to conventional transistor technology. The device of this invention is a memory device. It is also an illustration of a two-state device which switches "on" and "off". It is well known that any switching device capable of being turned "on" and "off" is a basic building block for a digital computer. Therefore, based upon the device of this disclosure, it is reasonable to design other elements for computers, such as registers, which are devices composed of "on" and "off" switches.

In the basic design of the invention disclosed and discussed, there is a single emitter and two collectors. However, this device may be designed with three or more collectors and a single emitter or an array of emitters. If more that two such collectors are used, it then becomes possible to build a digital computer with a base of three or more, instead of base 2 which is now used in all digital computers. Increasing the base obviously decreases the number of components required.

It should be noted at this time that the invention also comprises a cluster or plurality of field emitter array memory devices having a common substrate. In such a field emitter array cluster, each field emitter array memory device would comprise: a field emitter array memory device having an electron field emitter 11 located on the common substrate 13, first and second associated collector electrodes 29 and 31 located proximate to the emitter 11, and at least one associated deflector electrode (23 or 25) disposed between the emitter 11 and the associated collector electrodes. Each field emitter array would also include circuitry (33, 35, 37, 39 41, 43, 45 and 47 shown in FIG. 2) for establishing at least a first voltage between the emitter and the at least one deflector electrode (23 or 25), for establishing respective third and fourth voltages between the emitter 11 and each of the first and second collector electrodes 29 and 31), and for applying an input signal voltage to said at least one deflector electrode (23 or 25). Therefore, in each field emitter array memory device, the at least one deflector electrode switches a flow of electrons from one of the first and second collector electrodes (29 and 31) to the other one of the first and second collector electrodes when an input signal voltage is applied to the at least one deflector electrode.

In this invention, it is to be understood that a memory device, or computer device, comprised of a plurality of field emitter array memory devices disclosed above can be fabricated on the same substrate and connected together electrically in a manner similar to that known in the art of integrated circuits. In this manner a complete computer, or components thereof, can be fabricated.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A field emitter array memory device comprising:
   a substrate having an electron field emitter;
   at least one deflector electrode;
   a plurality of collector electrodes; and
   means for applying a control pulse to said at least one deflector electrode, whereby electrons from said emitter are switched from one collector electrode to another collector electrode.

2. A field emitter array memory device comprising:
   a substrate;
   an electron field emitter located on said substrate;
   a plurality of collectors located proximate to said emitter; and
   at least one deflector electrode located between said emitter and said collectors;
   whereby electrons flow from said emitter to at least one of said collectors when said at least one deflector electrode causes said electrons to move toward said collector.

3. The field emitter array memory device of claim 2 further including:
   an extraction electrode located between said emitter and said at least one deflector electrode.

4. The field emitter array memory device of claim 3 wherein said plurality of collectors comprises:
   first and second collectors; and
   said at least one deflector electrode comprises first and second deflector electrodes which deflect said electrons to one of said first and second collectors.

5. The field emitter device of claim 3 further including:
   a first insulator disposed between said substrate and said extraction electrode;
   a second insulator disposed between said extraction electrode and said deflector electrodes; and
   a third insulator disposed between said deflector electrodes and said collectors.

6. The field emitter array memory device of claim 5 wherein:
   said plurality of collectors comprises first and second collectors; and
   said at least one deflector electrode comprises first and second deflector electrodes which deflect said electrons to one of said first and second collectors.

7. The field emitter array memory device of claim 6 wherein :
   that one of said first and second deflector electrodes having the larger voltage difference with respect to said emitter determines which one of said first and second collectors will receive said electrons from said emitter.

8. A field emitter array memory device comprising:
   a field emitter array device including a substrate having an emitter located thereon, first and second collector electrodes located proximate to said emitter, and at least one deflector electrode disposed between said emitter and said collector electrodes;
   means for establishing at least a first voltage between said emitter and said at least one deflector electrode;
   means for establishing respective third and fourth voltages between said emitter and each of said first and second collector electrodes; and
   means for applying an input signal voltage to said at least one deflector electrode;
   whereby said at least one deflector electrode switches a flow of electrons from one of said first and second collector electrodes to the other of said first and second collector electrodes when an input signal voltage is applied to said at least one deflector electrode.

9. The field emitter array memory device of claim 8 wherein;
   the output of said device is the output signal voltage on one of said collector electrodes.

10. The field emitter array memory device of claim 8 wherein;
    said first and second collector electrodes are respectively biased to different voltages with respect to said emitter.

11. The field emitter array memory device of claim 10 wherein:
    said collector electrode having the larger voltage difference with respect to said emitter is established as the collector electrode receiving said electrons when said device is first turned on.

12. The field emitter array memory device of claim 11 wherein:
    said at least one deflector electrode switches the flow of electrons from one of said collector electrodes to the other of said collector electrodes after the device is first turned on.

13. The field emitter array memory device of claim 8 further including:
    an extraction electrode located between said emitter and said at least one deflector electrode.

14. The field emitter array memory device of claim 8 wherein said at least one deflector electrode includes only one deflector electrode, said device further including:
    means for selectively applying a positive voltage pulse or a negative voltage pulse to said deflector electrode, whereby said flow of electrons is switched from one of said first and second collector electrodes to the other one of said first and second collector electrodes as a function of whether said voltage pulse is negative or positive.

15. The field emitter array memory device of claim 8 wherein said at least one deflector electrode includes first and second deflector electrodes, said device further including:
    means for selectively applying a positive voltage pulse to one of said first and second deflector electrodes, whereby said flow of electrons is switched from one of said first and second collector electrodes to the other one of said first and second collector electrodes as a function of which of said first and second deflector electrodes receives said positive pulse.

16. A field emitter array cluster comprised of a plurality of field emitter array memory devices and a common substrate, each field emitter array memory device comprising:

a field emitter array device having an electron field emitter located on said common substrate, first and second associated collector electrodes located proximate to said emitter, and at least one associated deflector electrode disposed between said emitter and said associated collector electrodes;

means for establishing at least a first voltage between said emitter and said at least one deflector electrode;

means for establishing respective third and fourth voltages between said emitter and each of said first and second collector electrodes; and means for applying an input signal voltage to said at least one deflector electrode;

whereby said at least one deflector electrode switches a flow of electrons from one of said first and second collector electrodes to the other of said first and second collector electrodes when an input signal voltage is applied to said at least one deflector electrode.

17. The field emitter array cluster of claim 16 wherein said at least one deflector electrode in each field emitter array memory device includes only one associated deflector electrode and further includes:

means for selectively applying a positive voltage pulse or a negative voltage pulse to said deflector electrode, whereby said flow of electrons is switched from one of said first and second collector electrodes to the other one of said first and second collector electrodes as a function of whether said voltage pulse is negative or positive.

18. The field emitter array cluster of claim 16 wherein said at least one deflector electrode in each field emitter array memory device includes associated first and second deflector electrodes and further includes:

means for selectively applying a positive voltage pulse to one of said associated first and second deflector electrodes, whereby said flow of electrons is switched from one of said associated first and second collector electrodes to the other one of said associated first and second collector electrodes as a function of which of said associated first and second deflector electrodes receives said positive pulse.

19. The field emitter array cluster of claim 18 wherein in each field emitter array memory device:

that one of said associated first and second deflector electrodes having the larger voltage difference with respect to said associated emitter determines which one of said associated first and second collector electrodes will receive said electrons from said associated emitter.

* * * * *